United States Patent [19]
Kohyama

[11] 4,211,937
[45] Jul. 8, 1980

[54] MULTI-CHANNEL CHARGE COUPLED TRANSFER DEVICE

[75] Inventor: Susumu Kohyama, Kawasaki, Japan
[73] Assignee: Tokyo Shibaura Electric Co., Ltd., Kawasaki, Japan
[21] Appl. No.: 955,212
[22] Filed: Oct. 27, 1978

Related U.S. Application Data
[63] Continuation of Ser. No. 761,966, Jan. 24, 1977, abandoned.

[30] Foreign Application Priority Data

| Jan. 23, 1976 | [JP] | Japan | 51-586851 |
| Mar. 8, 1976 | [JP] | Japan | 51-2421451 |
| May 7, 1976 | [JP] | Japan | 51-5206251 |
| May 10, 1976 | [JP] | Japan | 51-5214551 |
| Aug. 2, 1976 | [JP] | Japan | 51-9220551 |

[51] Int. Cl.$^2$ .................. G11C 19/28; H03K 5/00; H01L 29/78
[52] U.S. Cl. ................ 307/221 D; 307/238; 357/24; 365/183
[58] Field of Search ............ 357/24; 307/221 D, 238; 365/183

[56] References Cited
U.S. PATENT DOCUMENTS

| 3,656,011 | 4/1972 | Weinberg | 357/24 |
| 3,889,245 | 6/1975 | Gosney | 357/24 |
| 3,944,990 | 3/1976 | Chou | 357/24 |
| 3,961,352 | 6/1976 | Colton et al. | 307/221 D |
| 3,967,254 | 6/1976 | Kosonocky et al. | 307/238 |
| 3,980,902 | 9/1976 | Tehon | 357/24 |
| 4,007,446 | 2/1977 | Elmer et al. | 357/24 |
| 4,032,948 | 6/1977 | Engeller et al. | 357/24 |

FOREIGN PATENT DOCUMENTS

2403190 8/1974 Fed. Rep. of Germany ............. 357/24

OTHER PUBLICATIONS

Sequin et al., Charge Transfer Devices, Academic Press, N.Y. (7/75), pp. 25–29, 247–249.
Rosenbaum et al., "A 16 Kilobit High Density CCD Memory", 1975, Int. Conf. Application of Charge Coupled Devices, San Diego (10/75), Proc. pp. 423–428.
Rosenbaum et al., "A 16 384-Bit High-Density CCD Memory", IEEE J. Solid State Circuits, vol. SC-11 (2/76), pp. 33–39.
Amelio, "Device Design for CCD Digital Memory", 3rd Int. Conf. Tecanol. and Applications of Charge Coupled Devices, Edinburgh (9/76), pp. 159–178

Primary Examiner—Gene M. Munson
Attorney, Agent, or Firm—Oblon, Fisher, Spivak, McCelland & Maier

[57] ABSTRACT

An electrode per bit (E/B) structure type charge transfer device in which N storage cell each consisting of a barrier region and a storage region are driven by N-phase clocks, one of N storage cells being empty and the remaining N-1 cells storing signal charge packets. The N-phase clocks are biased to a low level for storage and pulsed to a high level for transfer. The N storage cells are successively rendered in the transfer mode in the direction opposite to the charge transfer direction so that the empty cell is shifted to the adjacent preceding cell in the direction opposite to the charge transfer direction every time each of the N-phase clocks is pulsed. After one cycle of the N-phase clocks, all the signal charge packets are shifted to the succeeding cells respectively. A multiplexed electrode per bit (ME/B) structure type charge transfer device also is disclosed which employs the E/B structure and is operable by the clocks with small number of phases, providing a CCD memory with a large capacity.

9 Claims, 32 Drawing Figures

FIG. 1
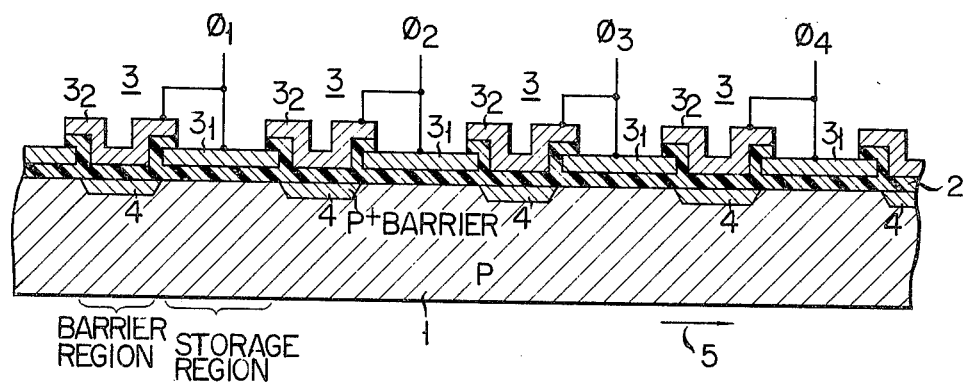
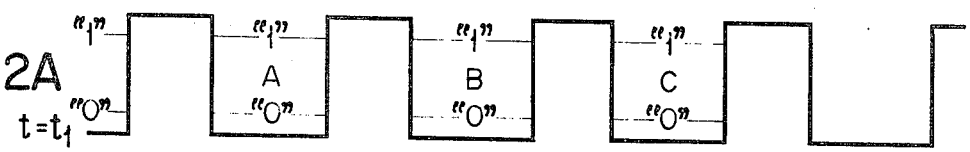
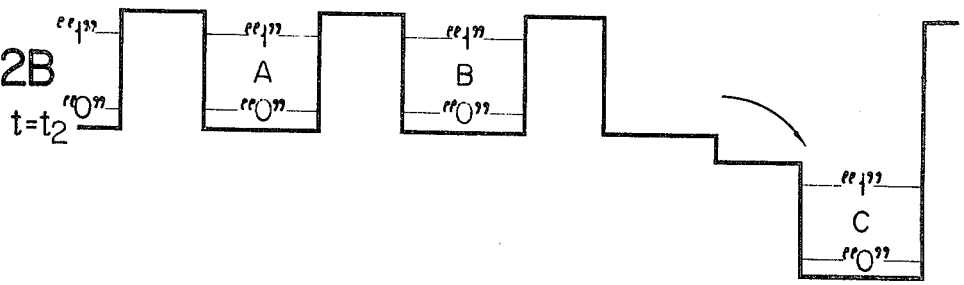
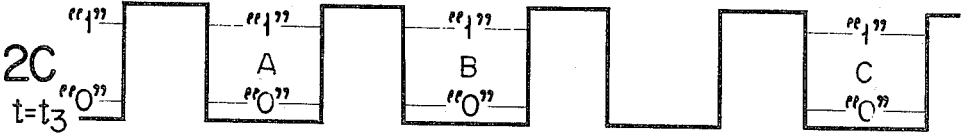
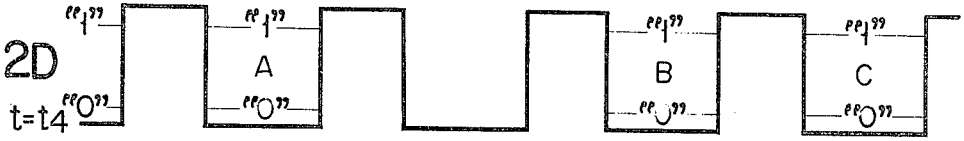
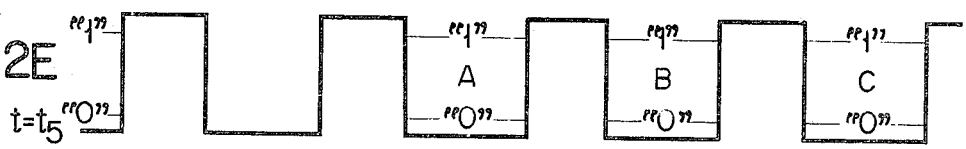

t=t₁ t=t₂ t=t₃ t=t₄ t=t₅ t=t₆

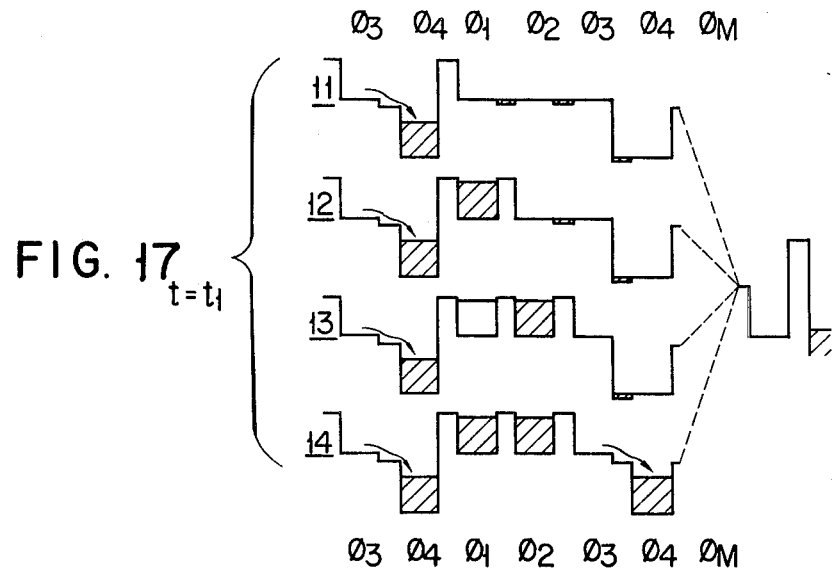
FIG. 17 t=t₁
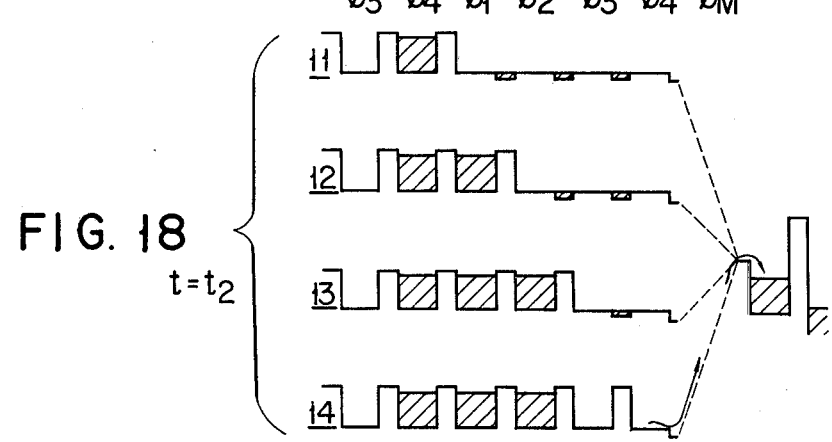
FIG. 18 t=t₂
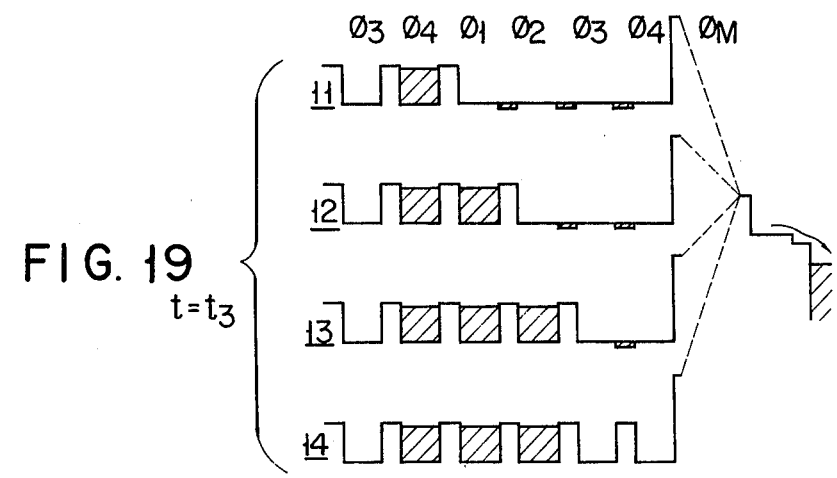
FIG. 19 t=t₃

MULTI-CHANNEL CHARGE COUPLED TRANSFER DEVICE

This is a continuation, of application Ser. No. 761,966, filed Jan. 24, 1977, now abandoned.

BACKGROUND OF THE INVENTION

The present invention relates to a charge transfer device.

A charge transfer device such as a bucket brigade device (BBD) or a charge coupled device (CCD) has been used as a delay line, a shift register or a memory. The memory is of a dynamic type using a shift register as memory elements. For the memory using charge transfer devices, the problem is how to obtain a high packing density.

Known driving systems for the charge transfer device are two-phase, three-phase and four-phase systems. These systems, however, need a plurality of storage cells for one bit. This disturbs it to make high the memory density. More particularly, two storage cells for one bit are necessary for the two- and four-phase driving systems; three storage cells for one bit are necessary for the three-phase driving system. Further, in any system, the signal charge transfer per bit is required a number of times (twice in the case of two-phase driving system and three times in the case of three-phase driving system). This results in a large transfer loss. To reduce the number of times of signal charge transfer and realize a memory with large capacity, the principle of an ME/B (multiplexed electrode per bit) structure is proposed in "1973 Tech. Dig. Papers, International Solid State Circuits Conference", Feb. 1973, pp 136 to 137, by D. R. Collins et al.

In the N-phase E/B structure are included a single empty storage cell and N-1 storage cells storing signal charges. The empty cell is shifted one cell each time a clock signal is applied thereto and the signal charges are shifted to the adjacent cells, respectively, after one cycle of clock signals. Accordingly, N-1 bits are formed by N signal charge storable regions. For this, the area per bit, compared with a charge transfer device by two-phase driving system, becomes (N/N−1)×½. This means that, when the N is large, the memory density is approximately doubled.

In the ME/B structure, N shift registers of the E/B structure are connected in parallel and the signal charges are multiplexed at the input and output by N-phase clock pulses. In this structure, when each register has M stages, the shift register of (N−1)×M bits is formed. Where the ME/B structure is realized with an existing driving system, the shift registers must be provided at the inputs with transfer gates, respectively, which are driven by separate clock pulses, in order to distribute successively input signal charges to the respective parallel shift registers. For this reason, in practice, 2N-phase clock pulses will be required. Furthermore, in the ME/B structure, shift registers must be so arranged that the registers are successively displaced by one phase at the input and output of the structure in the charge transfer direction. Thus, the structure has a problem in the layout and process when a large capacity memory is desired.

SUMMARY OF THE INVENTION

Accordingly, an object of the present invention is to provide an E/B structure charge transfer device with smaller storage cells necessary for storage and transfer of a single signal charge and a small number of times of signal charge transfer.

Another object of the present invention is to provide an ME/B structure charge transfer device suitable for realizing a large capacity memory.

The E/B structure type charge transfer device according to the present invention comprises: a semiconductor substrate; an insulating layer formed on the semiconductor substrate; transfer electrodes of N (N≧3) disposed on the insulating layer in the direction of charge transfer; means for forming a potential barrier in part at the charge incoming side of a semiconductor region under each of the electrodes in response to application of a potential for the storage mode to the transfer electrode, thereby to form a potential well in the remaining part of the semiconductor region for storing a signal charge packet therein, the potential barrier being lowered in potential compared to the barrier being in the storage mode in response to application of a potential for the transfer mode to the transfer electrode; and means for impressing N-phase clock pulse signals to the N transfer electrodes, respectively, the N-phase clock signals each being biased to low level for the storage of signal charge packet and pulsed to high level for the transfer of signal charge packet, and being successively pulsed to the high level in the order from the clock pulse signal applied to the final stage transfer electrode to the one applied to the first stage transfer electrode whereby the signal charge packets are shifted one potential well in the charge transfer direction during one cycle period of the clock pulse signals, while an empty potential well storing no signal charge packet therein is shifted in the direction opposite to the charge transfer direction.

An N-phase ME/B structure is obtained by connecting in parallel charge transfer channels of N each comprising the above-mentioned charge transfer device in such a manner that the charge transfer channels are successively displaced by one electrode at the input and output of the structure in the charge transfer direction and the corresponding electrodes of the channels arranged in the direction normal to the charge transfer direction are connected to receive the same clock. When one charge transfer channel has M stages, the N-phase ME/B structure has the bit length of (N−1)×M bits. A rectangular ME/B structure is obtained by disposing coupling cells at the input and output of the ME/B structure. Such a rectangular structure is advantageous for a high density integrated circuit. If the merging shift register is connected with the ME/B structure, the bit length may be flexibly set.

BRIEF DESCRIPTION OF THE DRAWING

FIG. 1 is a cross sectional view of an embodiment of a charge transfer device according to the present invention;

FIGS. 2A to 2E schematically illustrate the operation of the device of FIG. 1;

FIGS. 17 to 19 are views for schematically illustrating the operation of the embodiment of FIG. 14;

DETAILED DESCRIPTION OF THE PREFERRED EMBODIMENTS

Figure 3:
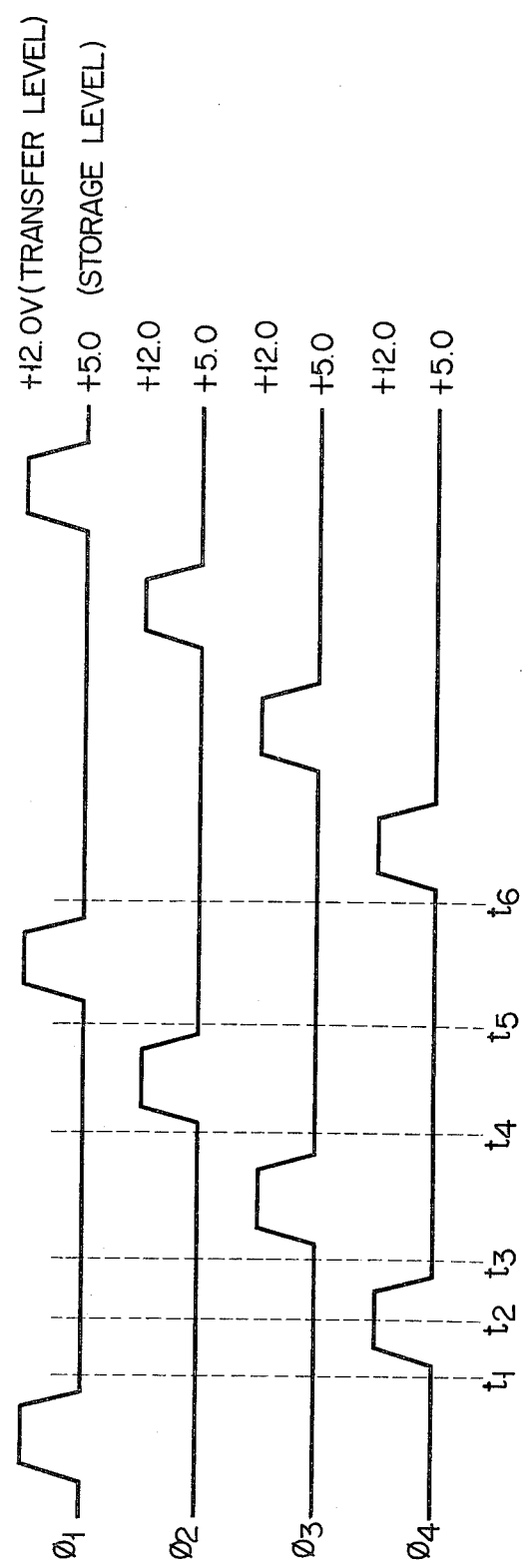
FIG. 3 is a timing chart of clock pulse signals.

Reference is now made to FIG. 1. As shown in the figure, an insulating layer 2 with thickness of about 1000 Å, for example, silicon dioxide ($SiO_2$) is formed on the major surface of a semiconductor substrate 1 of p-type silicon (100) of 7 to 8 Ω-cm for example. On the silicon oxide layer 2, are disposed transfer electrodes 3 of, for example, polysilicon in the charge transfer direction as indicated by an arrow 5. Each transfer electrode is divided into a first and second electrodes $3_1$ and $3_2$. P+ regions 4 are formed by the ion implantation of boron at the concentration of $1.5 \times 10^{12}$ cm$^{-2}$ in the semiconductor substrate 1 under the second electrodes $3_2$ disposed at the charge incoming side in order to form potential barriers. Four electrodes each consisting of a pair of first and second electrodes interconnected receive four phase clock signals $\phi_1$ to $\phi_4$, respectively. In the semiconductor region under the first electrode is formed a storage region or potential well for storing a signal charge while in the semiconductor region under the second electrode is formed a barrier region. The storage region and the barrier region cooperate to constitute a single storage cell.

The four phase clock pulse signals $\phi_1$ to $\phi_4$ are non-overlapping offset clocks as shown in FIG. 3 and each is normally biased to a low level (+5V) for signal storage and is pulsed to a high level (+12V) for signal transfer. FIGS. 2 and 3 will be referred to for explaining the operation of a charge transfer device when the four-phase clock signals $\phi_1$ to $\phi_4$ as just mentioned are supplied to four transfer electrodes 3 and the semiconductor substrate 1 is biased to −5V.

At the time $t_1$ that all of clock signals are at the low level, or the storage level, the potential barriers 6, as shown in FIG. 2A, is formed under the second electrodes $3_2$ while the potential wells 7 under the first electrodes $3_1$. Also at the time $t_1$, the potential well under the $\phi_4$ transfer electrode is an empty well storing no signal charge and the potential wells under $\phi_1$, $\phi_2$ and $\phi_3$ electrodes store signal charges A, B and C of "1" or "0". At the time $t_2$ that the clock $\phi_4$ is pulsed to high level, the surface potential on the substrate under the $\phi_4$ electrode becomes lower than that of potential well under the electrode $\phi_3$, as shown in FIG. 2B, with the result that the signal charge C stored in the potential well under the $\phi_3$ electrode flows into the empty deep potential well under the $\phi_4$ electrode. At the time $t_3$ that the clock signal $\phi_1$ is at the low level, the signal charge C stored in the potential well under the $\phi_3$ electrode has been transferred into the storage cell under the $\phi_4$ electrode. At the time $t_4$, the storage cell under the $\phi_2$ electrode becomes empty as shown in FIG. 2D and the signal charge B stored in the storage cell has been transferred to the storage cell under the $\phi_3$ electrode. At the time $t_5$, the storage cell under the $\phi_1$ electrode becomes empty as shown in FIG. 2E and the signal charge A stored in the storage cell has been transferred into the storage cell under the $\phi_2$ electrode. At the time $t_6$ when one cycle of clock pulse signals is completed, the storage cell under the $\phi_4$ electrode becomes empty as in the case of FIG. 2A and the signal charge C stored in the storage cell is transferred into the succeeding stage of storage cell.

As described above, in the charge transfer device of the present invention, a potential barrier is formed at the portion of the charge incoming side of each storage cell by application of the low level potential thereto, and only the potential to the empty storage cell is pulsed to the high level, whereby the empty storage cell is shifted to the adjacent preceding cell in the direction opposite to the charge transfer direction and, after one cycle of clock pulses, all the signal charges are shifted to the adjacent succeeding storage cells.

Figure 4:
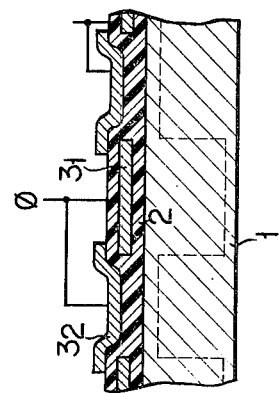
FIG. 4 is a cross sectional view of another embodiment of charge transfer device according to the present invention.

An embodiment of FIG. 1 is a 3-bit shift register including four storage cells. Generally, N-phase clock pulse signals and N storage cells are combined to form a shift register of N−1 bits. N is the number of 3 or more. The charge transfer device of the present invention is applicable for a delay line for analogue signal as well as a shift register for the binary signal "1" or "0". In the example of FIG. 1, the respective transfer electrodes are divided. This results from the intention to improve the packing density of an integrated circuit. Therefore, the division of the transfer electrode is not essential in the invention. Further, although the FIG. 1 example employs p-type substrate, n-type substrate having n+-type barrier may also be used for the substrate. In this case, the operation as shown in FIGS. 2A to 2B is permitted using the clock pulse signals as shown in FIG. 3. In the FIG. 1 example, the high concentration impurity region 4 under the second electrode $3_2$ is used to form the potential barrier. The potential barrier may also be formed in a manner that the oxide layer under the second electrode $3_2$ is made thicker than the oxide film under the first electrode $3_1$ as shown in FIG. 4.

The non-overlapping clocks are shown in FIG. 3, however, the use of non-overlapping clock signals is not essential for the purpose of operating a single shift register. Overlapping clocks may be used in which the electrodes $\phi_1$, $\phi_2$, $\phi_3$ and $\phi_4$ are set successively in this order to the transfer mode and then returned successively in the same order to the storage mode. In more detail, if the $\phi_4$ electrode is first set to the transfer mode, then the $\phi_3$ electrode may be set to the transfer mode before the $\phi_4$ electrode is returned to the storage mode. If the $\phi_1$, $\phi_3$, $\phi_2$ and $\phi_1$ electrodes are set successively to the transfer mode, then the $\phi_4$, $\phi_3$, $\phi_2$ and $\phi_1$ electrodes may be all in the transfer mode.

In this description, the meaning that the potential well is empty involves that the empty potential well stores no charge and that it stores a charge below the signal charge representing "0" as in the case of BBD. For this reason, the surface potential of the barrier region of a storage cell in the transfer mode is not necessarily required to be lower than that of the storage region of the adjacent preceding storage cell being in the storage mode as shown in FIG. 2B.

The use of the charge transfer device mentioned above enables the ME/B structure operable with clock pulses having a small number of phases to be realized.

Figure 6:
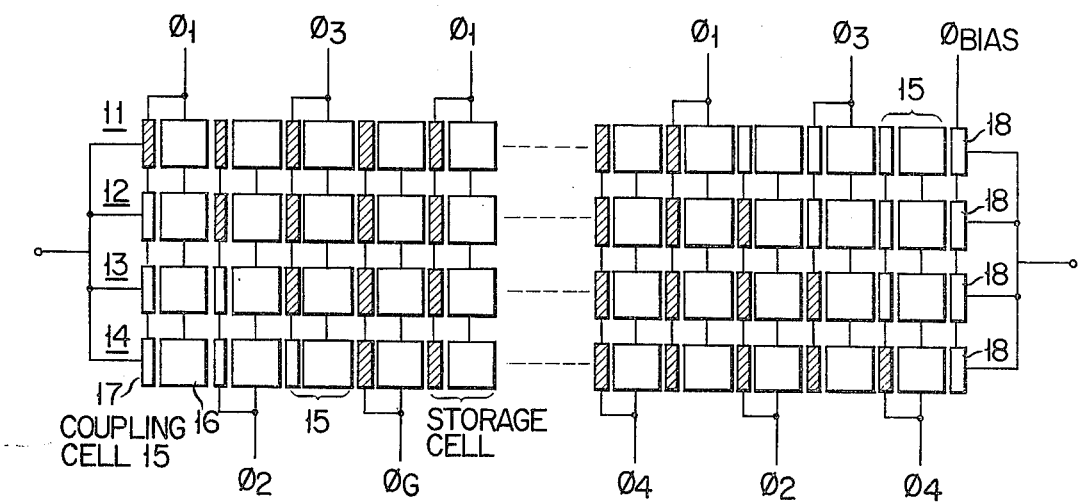
FIG. 6 is a modification of the ME/B shift register block of FIG. 5 which is suitable for an integrated circuit version.

Turning now to FIG. 6, there is shown a plan view of an ME/B shift register block including four charge transfer channels or shift registers 11, 12, 13 and 11 connected in parallel and driven by four-phase clock pulses, each charge transfer channel comprising M stages each consisting of a barrier region and a storage region. The shift registers 11 to 14 are so arranged that they are successively displaced by one stage at the input and output of the shift register block in the charge transfer direction, and the corresponding stages of the registers arranged in the direction normal to the charge transfer direction are supplied with the same clock. The first stages of the shift registers are all connected to the input node, while the final stages to the output node. The clock pulses $\phi_1$ to $\phi_4$ are distributed to the respective shift registers in order that a series of four stages of each register are successively set to the transfer mode in the direction opposite to the charge transfer direction. The use of the non-overlapping offset clocks as shown in FIG. 3 is highly desirable for the ME/B structure. Under the control of the FIG. 3 clock pulses, the first stages of the respective shift registers are successively set to the transfer mode one by one. Therefore, the input signal charge from the input node never fail to be distributed to any one of the shift registers. At the output side, the final stages likewise are successively set to the transfer mode. The output of the shift register block is detected by the potential variation caused by a charge transferred from a register to the precharged output node.

With the ME/B structure including shift registers each having M stages and using N-phase clock signals, a shift register block having $(N-1) \times M$ bits is constituted.

The FIG. 6 ME/B structure is of rhombus type so that it is unsuitable for high packing density integrated circuit fabrication. The rectangular type structure as shown in FIG. 6 is desirable for such high density integrated circuit fabrication. In the FIG. 6 structure, the non-storage or coupling cell or cells 15 are provided between the first stage storage cells of the registers 12, 13 and 14 and the input node and between the final steps of the registers 11 to 13 and the output node. The coupling cell is comprised of the first and second electrodes 16 and 17, as in the storage cell. The surface potential under the first and second electrodes in the storage mode is substantially equal to that of the storage region of the storage cell in the storage mode. Therefore, the coupling cell has no ability to store the signal charge. The same clock signal is applied to the corresponding four cells of the registers 11 to 14 disposed in the direction normal to the charge transfer direction. Electrodes 18 are formed at the output side of the final stage cells of the registers 11 to 14 to apply a bias potential to the substrate.

Figure 5:
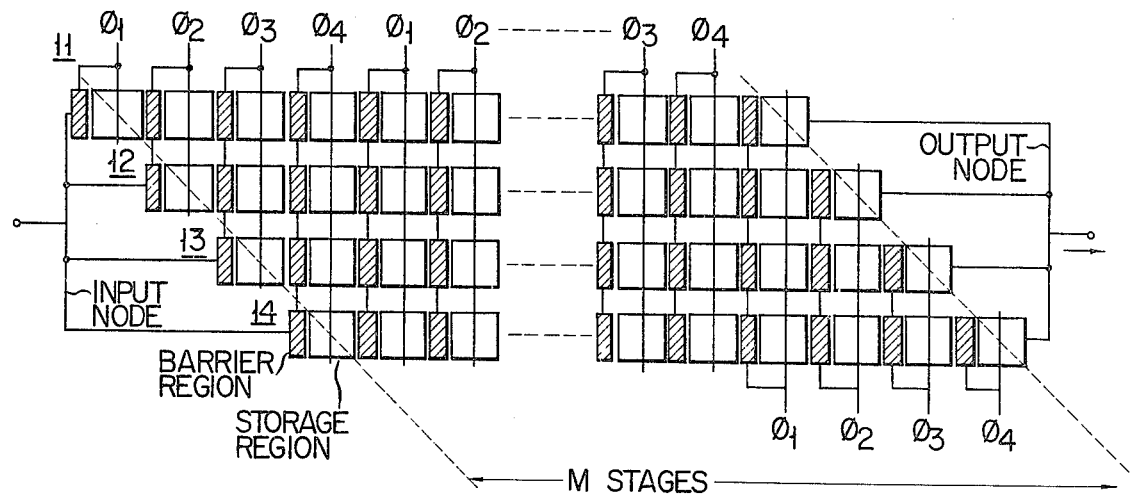
FIG. 5 is a plan view of an ME/B shift register block using the charge transfer device of the present invention.

The ME/B structure shown in FIG. 6 is operable as that of FIG. 5. When the process variation is taken into consideration, it is difficult to make equal the surface potentials under the first and second electrodes 16 and 17 of the coupling cell. When the surface potential under the second electrode 17 is higher than that of the first electrode 16, a barrier is formed under the electrode 17 to deteriorate the margin of the signal charge by trapping a charge. If the barrier is about 1/10 or less that of the storage cell, the deterioration of the margin may be compensated for through an electrical process. To ensure the margin of the signal charge, it is preferable to make equal the surface potentials under the first and second electrodes of the coupling cell, or to lower the surface potential under the second electrode compared with that under the first electrode by making difference in thickness between oxide layers under the first and second electrodes and/or by ion implantation.

Figure 7:
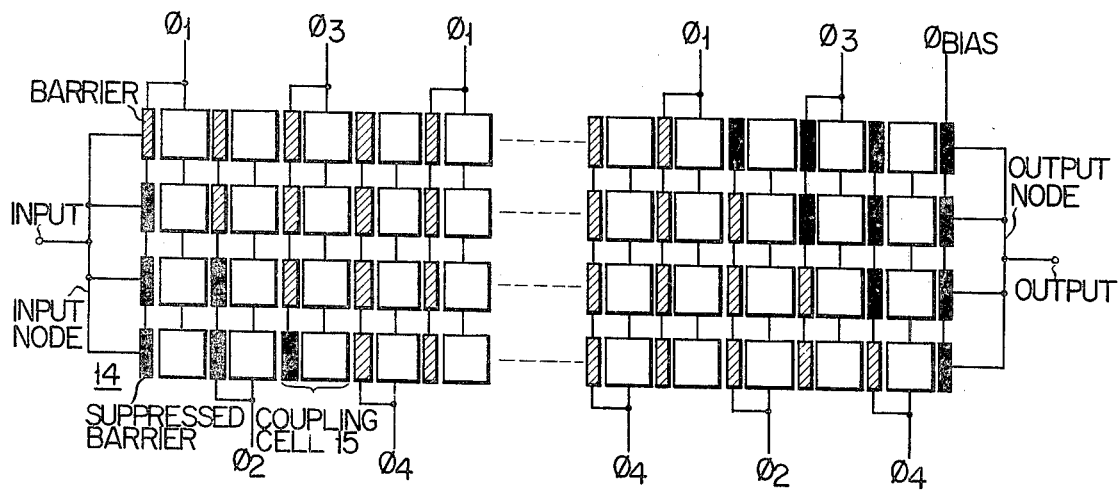
FIG. 7 is a further modification of the ME/B shift register block of FIG. 6.
Figure 8:
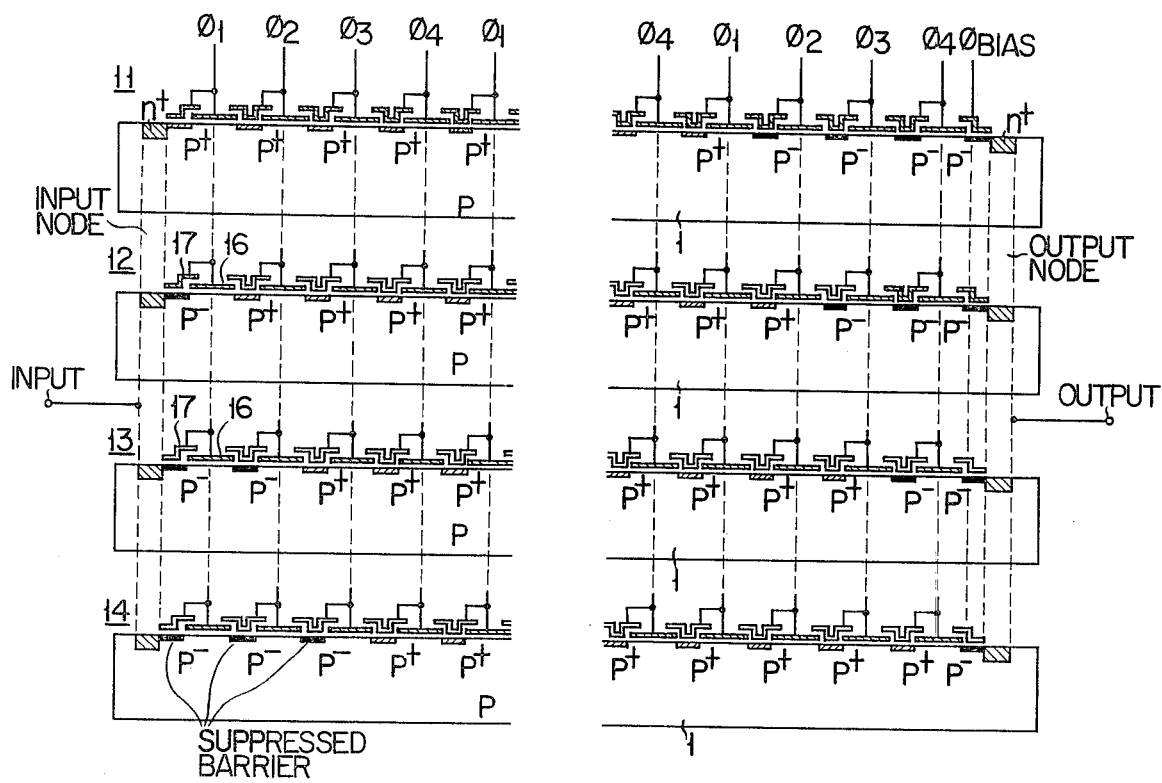
FIG. 8 is a cross sectional view of the respective channels of the ME/B shift register block of FIG. 7.
Figure 9:
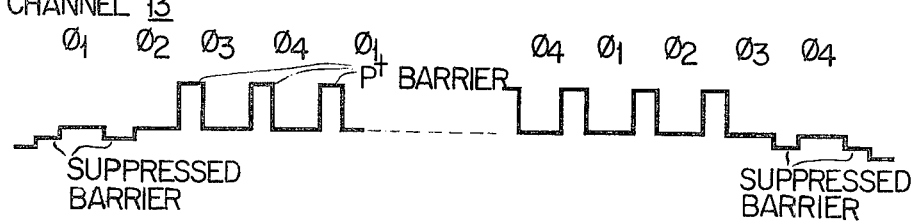
FIG. 9 is a surface potential in the storage mode of one of the channels of FIG. 8.

Referring now to FIG. 7, there is shown an example of the transfer device in which suppressed barriers are formed under the second electrodes of the coupling cells and the bias electrode, in order to ensure the signal charge margin. In the figure, shadowed portions indicate the p+ barriers of the storage cells and blacked portions the p− suppressed barriers of the coupling cells. The suppressed barrier may be formed by implanting phosphor ions, at the concentration of, for example, $2 \times 10^{11}$ cm$^{-2}$, in the p-type substrate. The cross section of each charge transfer channel of FIG. 7 is illustrated in FIG. 8. The ME/B structure is provided at the input and output with n+ type input and output nodes formed in the substrate 1 in the direction normal to the charge transfer direction. By way of example, the surface potential of the channel 13 in the storage mode is schematically shown in FIG. 9.

Figure 10:
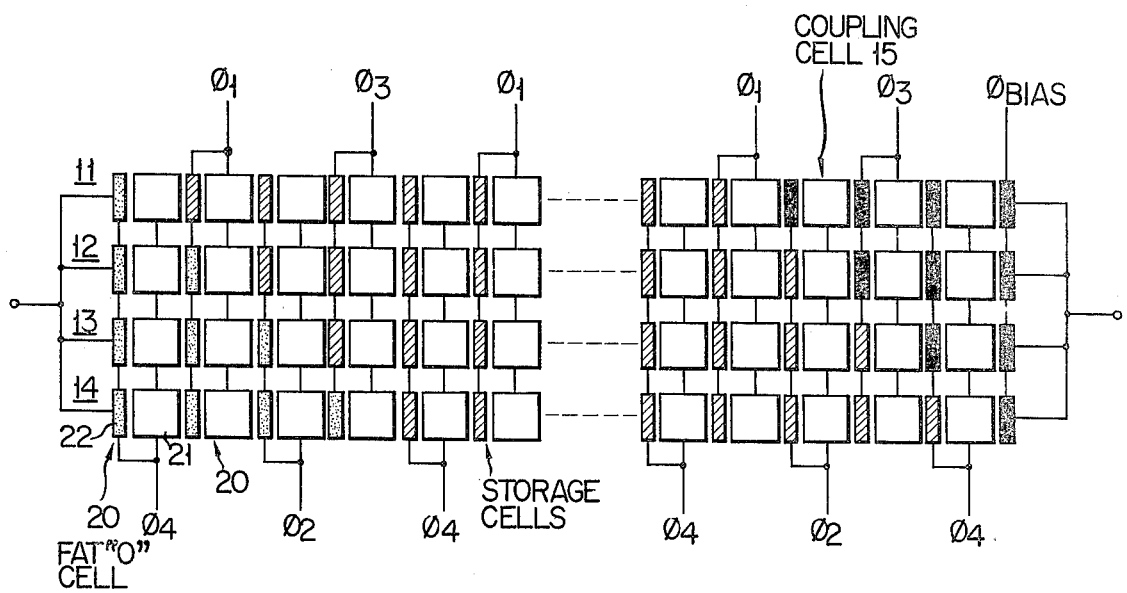
FIG. 10 is a still further modification of FIG. 7.
Figure 11:
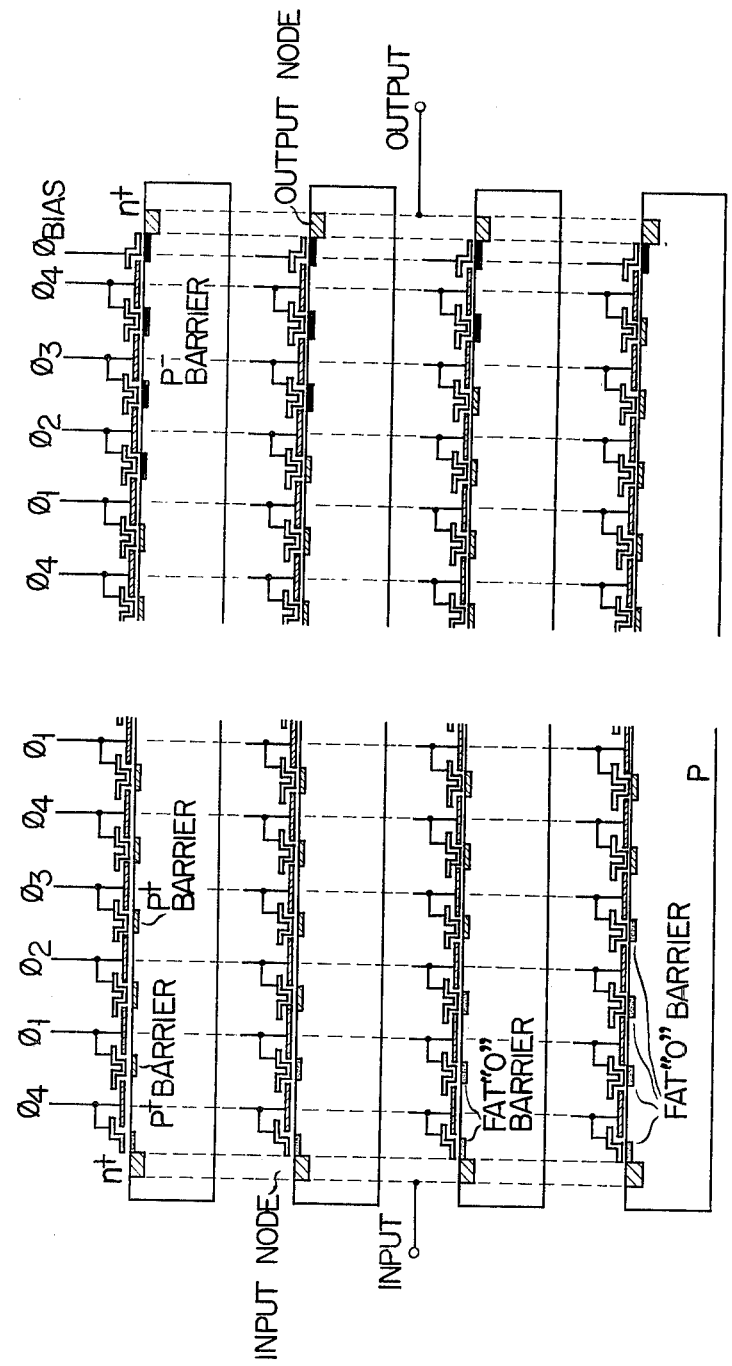
FIG. 11 is a cross sectional view of each channel of the ME/B shift register block of FIG. 10.

A modification of the FIG. 7 example is shown in FIG. 10 that includes a fat "0" cells 20 for injecting the fat "0" charge into the respective channels provided between the first stage storage cells and the input node. The FIG. 10 embodiment also includes coupling cells having suppressed barriers, as in the FIG. 7 embodiment, formed between the final stage storage cell and the output node. Each fat "0" cell is comprised of a storage region 21 for storing the fat "0" charge and a fat "0" barrier region 22 whose surface potential is slightly higher than that of the storage region. The fat "0" barrier is formed by ion implantation of boron at the concentration of, for example, $1.5 \times 10^{11}$ cm$^{-2}$. As a matter of course, the fat "0" barrier may also be formed with the oxide layer above the barrier region which is thicker compared to that above the storage region. The cells constituting the channel is increased by one stage as compared with the FIG. 7 embodiment, because of the fat "0" charge injection to the respective channels. The clock pulse $\phi_4$ is applied to the first stage fat "0" cells of the respective channels. The cross section of the channels of FIG. 10 is illustrated in FIG. 11.

Figure 13:
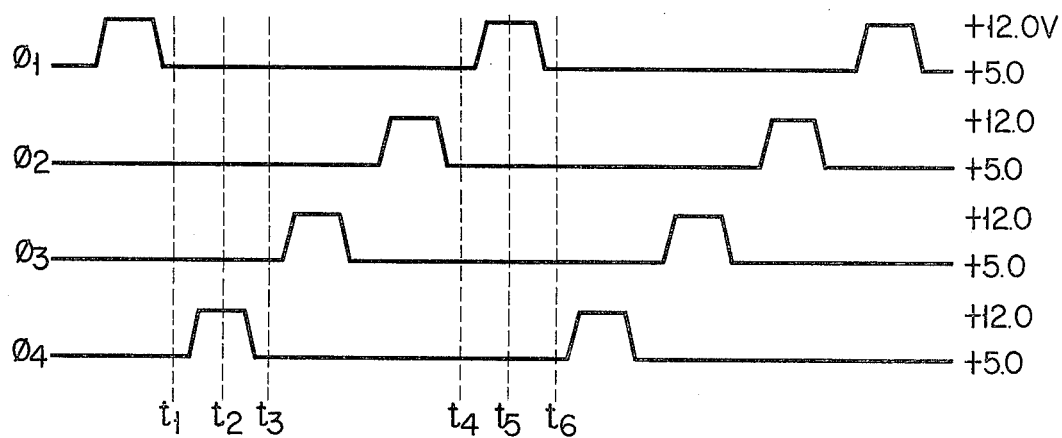
FIG. 13 is a timing chart used in explaining the operation of the ME/B shift register block of FIG. 10.
Figure 12A:
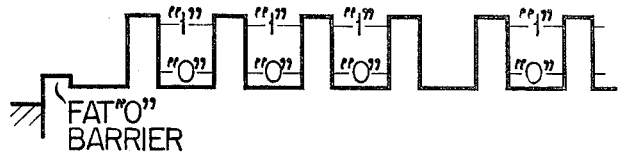
FIGS. 12A to 12F are a set of diagrams useful in explaining the operation of the ME/B shift register block of FIG. 10.
Figure 12B:
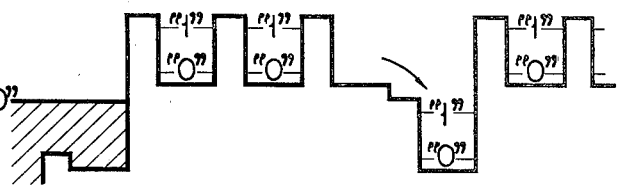
Figure 12C:
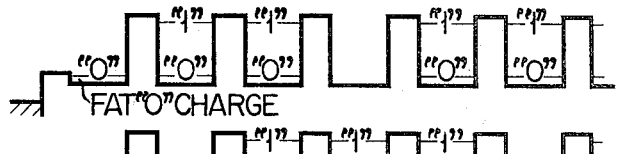
Figure 12D:
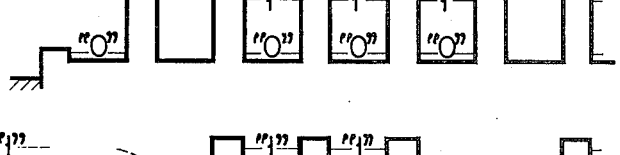
Figure 12E:
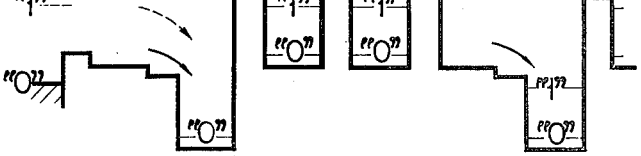
Figure 12F:
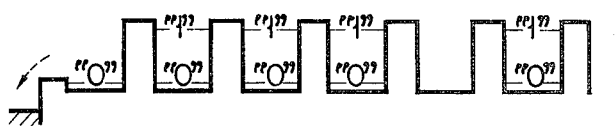

The operation at the input of the first channel 11 of the FIG. 10 device will be given referring to FIGS. 12 and 13. At the time $t_1$ after the clock pulse $\phi_1$ is pulsed to high level, all the clocks are at the low level, and the cells receiving the $\phi_4$ clock pulse are all empty, as shown in FIG. 12A. At this time, the cells for other clock pulses $\phi_1$, $\phi_2$ and $\phi_3$ store therein the signal charges of "1" or "0". At the time $t_2$, the data sampling time for the fourth channel 11, the potential wells of the cells driven by clock $\phi_4$ become deep and receive the signal charge packets flowing out of the preceding cells driven by the clock $\phi_3$. As shown in FIG. 12B, at the time $t_2$, the input source level is "0" and the fat "0" barrier of the fat "0" cell of the first channel 11 is lowered below "0" level. Accordingly, at the time $t_3$ after the clock $\phi_4$ returns to the low level, the fat "0" charge packet is stored in the fat "0" cell of the first channel 11. At the time $t_4$ before the clock $\phi_{11}$ is pulsed to the high level, the $\phi_1$ cells are all empty as shown in FIG. 12D. At the time $t_5$, the data sampling time for the first channel 11, the $\phi_1$ driven cells receive the signal charge packets from the preceding cells, as shown in FIG. 12E. When the input source level is "0", the first stage $\phi_1$ driven storage cell of the first channel 11 receives the fat "0" charge packet from the fat "0" cell, as shown in FIG. 12E. When the input source level is "1", the signal charge packet of "1" is injected into the first stage $\phi_1$ dirven storage cell over the fat "0" barrier. At the data sampling time $t_5$ of the first channel 11, when the input source is at the "1" level, excessive charges flow back to the input source at the time $t_6$ when the clock $\phi_1$ returns to the low level, and at this time the fat "0" charge remain in the fat "0" cell, as shown in FIG. 12F. The operation of the channel 11 is similarly applied for other channels. Accordingly, no explanation of other channel operations will be given.

The ME/B shift register blocks shown in FIGS. 5, 6, 7 and 10 each have the bit length of $(N-1)\times M$ bits. If the merging shift register having an arbitrary bit length is coupled with the ME/B shift register block, the bit length of the register block may be flexibly set. The merging shift register is driven by the clock pulse with the frequency N times the N-phase clock pulses' frequency applied to the ME/B block. Suppose now that the merging shift register has the bit length of S. The total bit length is $(N-1)\times M+S$.

Figure 14:
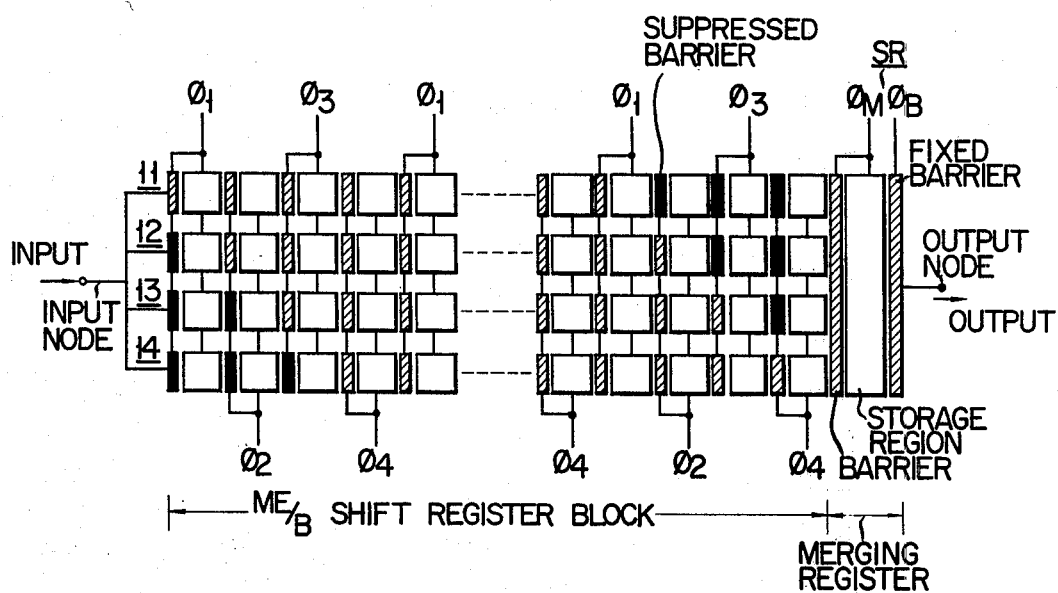
FIG. 14 is an ME/B shift register block of the present invention coupled with the merging shift register.
Figure 16:
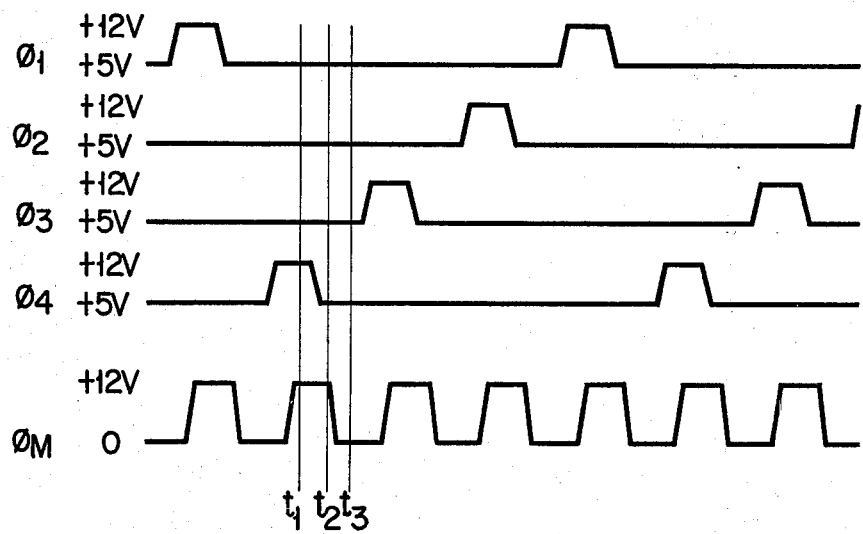
FIG. 16 is a timing chart useful in explaining the operation of the embodiment of FIG. 14.
Figure 15:
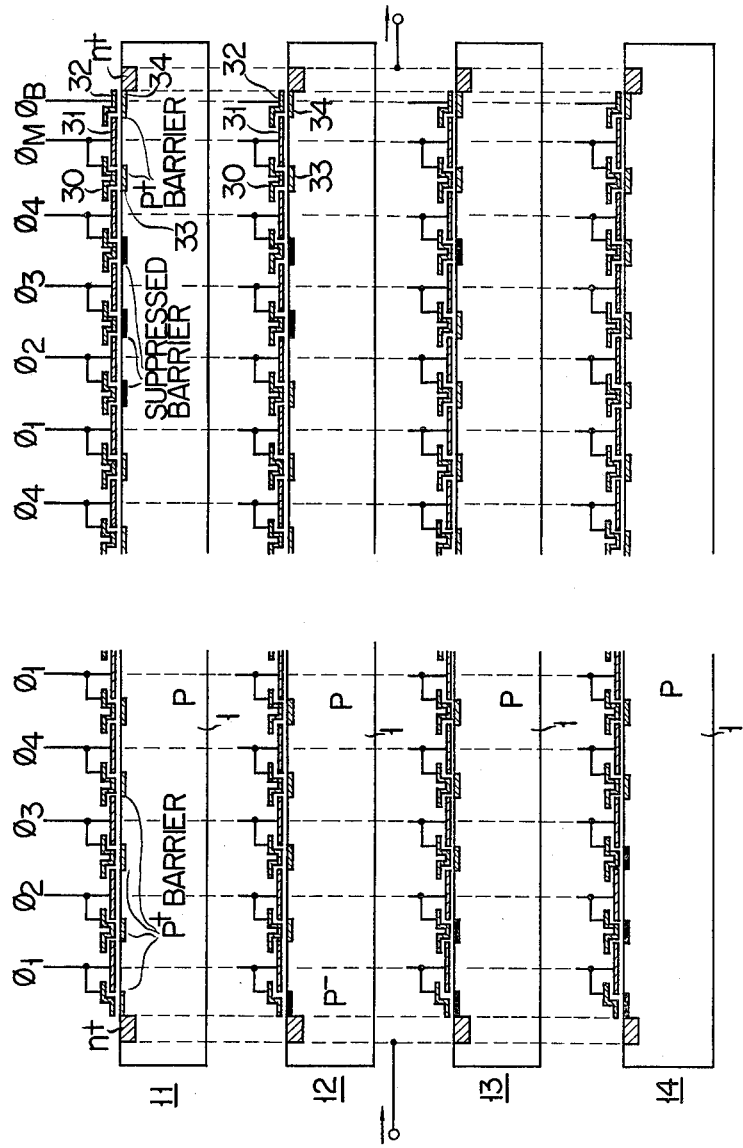
FIG. 15 is a cross sectional view of each channel of the embodiment of FIG. 14.

Referring to FIG. 14, there is shown an example of the FIG. 7 ME/B shift register block followed by a merging shift register SR with one bit. As shown in FIG. 14, at the output side is provided one bit storage cell including barrier and storage regions, and a fixed barrier region, those regions being common to all the channels. The cross section of the respective channels are shown in FIG. 15. P+ region 33 for forming p+ barrier is formed under the electrodes 30. P+ region 34 for forming the fixed barrier is formed under electrodes 32 to which the bias potential $\phi_B$ is applied. The clock $\phi_M$ having the frequency four times the clocks $\phi_1$ to $\phi_4$ is applied to the electrodes 30 and 31 of the merging shift register SR. A relationship between the clocks $\phi_1$ to $\phi_4$ and the clock $\phi_M$ is shown in FIG. 16. The clock $\phi_M$ is biased to a low level of 0 V and pulsed to a high level of +12 V.

The operation of the FIG. 14 example will be described with reference to FIGS. 16 to 19. At the time $t_1$ when only the clocks $\phi_4$ and $\phi_M$ are pulsed to the high level, the potential wells under the clocks $\phi_4$ and $\phi_M$ electrodes become deep. Accordingly, the signal charge packets stored in the preceding storage cells under the $\phi_3$ electrode, flows into the potential wells under the $\phi_4$ electrodes of the ME/B shift register block. With the final stages, only the final stage $\phi_4$ driven storage cell of the fourth channel 14 receives the signal charge packet from the $\phi_3$ driven storage cell. At the time $t_1$, although the potential well of the shift register is deep the merging shift register SR receives no signal charge packet since the potential well under the $\phi_4$ electrode is also deep.

At the time $t_2$, the clock $\phi_4$ returns to the storage level, while the clock $\phi_M$ is kept at the transfer level. Accordingly, the final stage potential well of the fourth channel rises in the potential level so that the signal charge packet is transferred into the deep potential well of the shift register SR. At this time, the signal charge packet transferred to the merging shift register fails to pass the fixed barrier formed by the bias potential $\phi_{BIAS}$ and thus fails to reach the sense node.

At the time $t_3$ when the clock $\phi_M$ is at the low level, the potential of the storage cell of the merging shift register, as shown in FIG. 19, rises above the fixed barrier so that the signal charge stored in the storage cell flows into the detection node.

Figure 20:
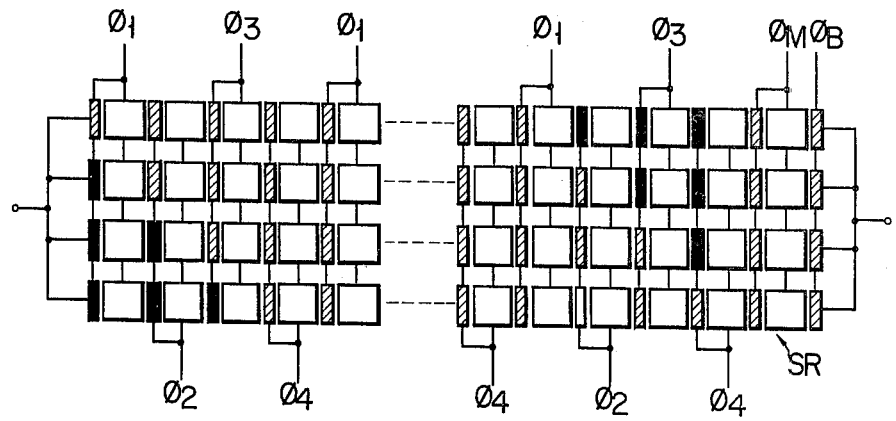
FIG. 20 is a modification of the embodiment of FIG. 14.

While a single shift register SR common to the respective channels is used in the FIG. 14 embodiment, separate merging shift registers may be connected to the channels, respectively, as shown in FIG. 20. The merging shift register having any bit length may be used, although the FIG. 14 embodiment uses a single bit shift register.

Figure 21:
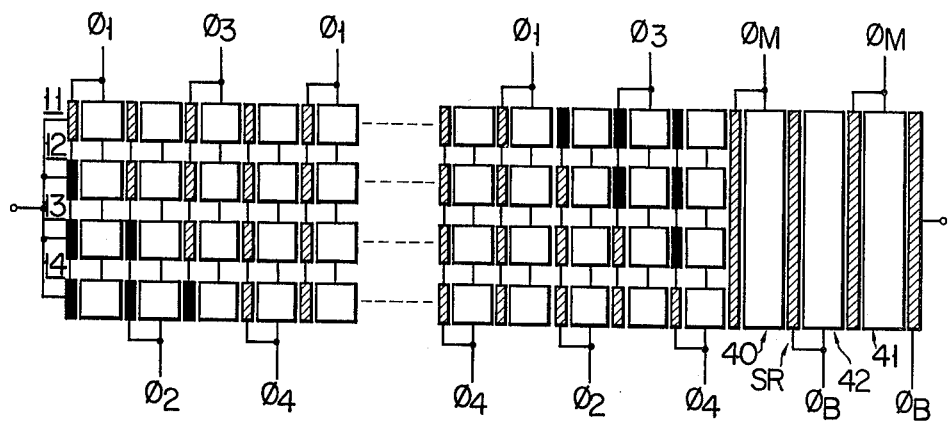
FIG. 21 is another modification of the embodiment of FIG. 14.
Figure 22:
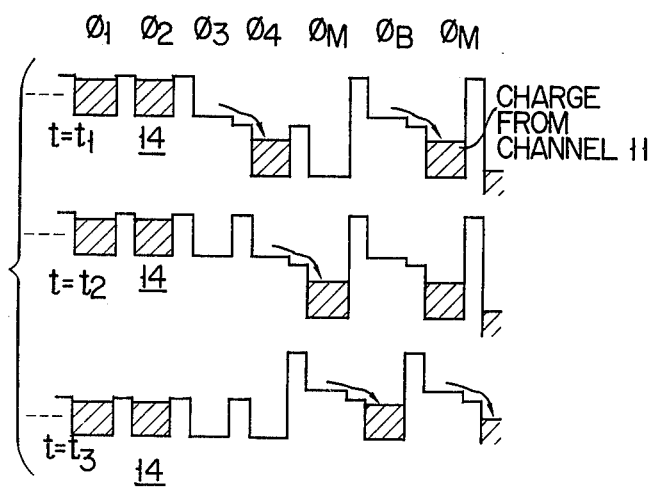
FIG. 22 schematically illustrates the operation of the embodiment of FIG. 21.

The embodiment of FIG. 21 uses the merging shift register of two bits. In this embodiment, the fixed storage cell 42 supplied with the bias potential $\phi_B$ is provided between the storage cells 40 and 41 driven by the clock $\phi_M$ in order to avoid the mixing of signal charges. The operation at the output side of the fourth channel 14 in this example is illustrated in FIG. 22. Times $t_1$, $t_2$ and $t_3$ in FIG. 22 correspond to those times $t_1$, $t_2$, and $t_3$ in the timing diagram of FIG. 16.

Figure 23:
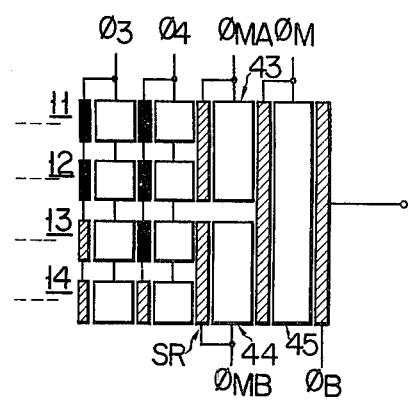
FIG. 23 is other modification of the embodiment of FIG. 14.

The merging shift register may be constructed as shown in FIG. 23. More precisely, the merging shift register is comprised of a storage cell 43 which receives in common a signal charge packet from the channels 11 and 12 of the ME/B block and is driven by a clock $\phi_{MA}$, and another storage cell 44 which receives in common a signal charge packet from the channels 13 and 14 and is driven by a clock $\phi_{MB}$ and still another storage cell 45 connected to the outputs of the storage cells 43 and 44 and is driven by the clock $\phi_M$. The frequencies of the clocks $\phi_{MA}$ and $\phi_{MB}$ are two times those of clocks $\phi_1$ to $\phi_4$.

The requisitions for the merging shift register are to receive charges transferred from the respective channels of the ME/B block without being mixed and to feed out them to the output node. Therefore, the timing relation of the clock $\phi_M$ to clocks $\phi_1$ to $\phi_4$ is not limited to that as shown in FIG. 16. The clock $\phi_M$ has a large timing tolerance. More precisely, the receiving of the signal charge packet fed from the channel 11 is permitted during the period from the time when the clock $\phi_1$ becomes at the storage level to the time when the clock $\phi_4$ becomes at the transfer level. Therefore, the clock $\phi_M$ is permitted to become at high level during this time interval. The transfer of the signal charge packet derived from the channel 11 and stored in the merging shift register to the output node is permitted during the period from the time when the $\phi_M$ becomes at the transfer level to the time when the $\phi_M$ returns to the storage level so that the charge packet derived from the channel 11 is not mixed with the charge packet from the channel 14.

Two-phase, three-phase and four-phase driving systems, for example, may be employed to drive the merging shift register. In the merging shift register drive, care must be taken in only the timing of the drive pulse, in order to avoid mixture of the signal charge packets from the respective channels.

This invention is applicable to either a surface channel device or a buried channel device.

What is claimed is:

1. A charge transfer device comprising:
a semiconductor substrate of one conductivity type;
an insulation layer formed on said substrate;
N charge transfer channels arranged in parallel and having inputs connected to a common input node formed in said substrate and outputs to a common output node formed in said substrate and each channel including P transfer electrodes disposed on said insulating layer in a charge transfer direction, the N corresponding transfer electrodes of the respective charge transfer channels being arranged in the direction normal to the charge transfer direction and being electrically connected together;
means for forming a potential barrier in part at the charge incoming side of said semiconductor substrate under each of only M (<P) successive transfer electrodes of each of said N charge transfer channels in response to application of a potential of a storage level to the transfer electrode to form a storage cell under each of said M electrodes of each of said charge transfer channels for storing a signal charge packet, the N sets of said respective M transfer electrodes under which said potential barriers are to be formed being arranged such that the first electrodes of said respective M successive transfer electrodes are successively displaced by one transfer electrode in the charge transfer direction at the input side of said charge transfer channels and the last electrodes of said respective M successive transfer electrodes are successively displaced by one transfer electrode in the charge transfer direction at the output side of said charge transfer channels, and said storage cell being responsive to application of a potential of a transfer level on the associated transfer electrode to receive a signal charge packet from the adjacent preceding cell at the storage level;
means for applying N-phase non-overlapping offset clock pulse signals to said transfer electrodes of said N charge transfer channels, said clock pulse signals each being normally biased to the storage level and pulsed to the transfer level in order that N successive transfer electrodes in each of said charge transfer channels are successively set to the transfer level in the direction opposite to the charge transfer direction whereby input data from said input node are sequentially applied to said N transfer channels and parallel data from said charge transfer channels are applied sequentially to said output node by said N-phase clock signals and, in each of said charge transfer channels, a signal charge packet is shifted one storage cell in the charge transfer direction during one cycle period of said N-phase clock pulse signals while an empty storage cell is shifted one cell position in the direction opposite to the charge transfer direction each time a clock signal is pulsed; and,
means for forming a fat "O" potential barrier in part at the charge incoming side of said semiconductor substrate under each of transfer electrodes disposed between said input node and the first electrode of said respective M successive transfer electrodes of said charge transfer channels to store a fat "O" charge under the associated transfer electrode.

2. A charge transfer device comprising:
a semiconductor substrate of one conductivity type;
an insulation layer formed on said substrate;
N charge transfer channels arranged in parallel and having inputs connected to a common input node formed in said substrate and outputs to a common output node formed in said substrate and each channel including P transfer electrodes disposed on said insulating layer in a charge transfer direction, the N corresponding transfer electrodes of the respective charge transfer channels being arranged in the direction normal to the charge transfer direction and being electrically connected together;
means for forming a potential barrier in part at the charge incoming side of said semiconductor substrate under each of only M (<P) successive transfer electrodes of each of said N charge transfer channels in response to application of a potential of a storage level to the transfer electrode to form a storage cell under each of said M transfer electrodes of each of said charge transfer channels for storing a signal charge packet, the N sets of said respective M transfer electrodes under which said potential barriers are to be formed being arranged such that the first electrodes of said respective M successive transfer electrodes are successively displaced by one transfer electrode in the charge transfer direction at the input side of said charge transfer channels and the last electrodes of said respective M successive transfer electrodes are successively displaced by one transfer electrode in the charge transfer direction at the output side of said charge transfer channels, and said storage cell being responsive to application of a potential of a transfer level on the associated transfer electrode to receive a signal charge packet from the adjacent preceding cell at the storage level;
means for applying N-phase non-overlapping offset clock pulse signals to said transfer electrodes of said N charge transfer channels, said clock pulse signals each being normally biased to the storage level and pulsed to the transfer level in order that N successive transfer electrodes in each of said charge transfer channels are successively set to the transfer level in the direction opposite to the charge transfer direction whereby input data from said input node are sequentially applied to said N transfer channels and parallel data from said charge transfer channels are applied sequentially to said output node by said N-phase clock signals and, in each of said charge transfer channels, a signal charge packet is shifted one storage cell in the charge transfer direction during one cycle period of said N-phase clock pulse signals while an empty storage cell is shifted one cell position in the direction opposite to the charge transfer direction each time a clock pulse signal is pulsed; and
means for forming a suppressed barrier in part at the charge incoming side of said semiconductor substrate under each of transfer electrodes disposed between said output node and the last electrodes of said respective M successive transfer electrodes of said charge transfer channels.

3. A charge transfer device comprising:
a semiconductor substrate of one conductivity type;
an insulation layer formed on said substrate;
first to Nth charge transfer channels arranged in parallel and having inputs connected to a common input node formed in said substrate and outputs to a common output node formed in said substrate and each channel including first to Pth transfer electrodes disposed on said insulation layer in a charge transfer direction, the N corresponding transfer electrodes of the respective charge transfer channels being arranged in the direction normal to the charge transfer direction and being electrically connected together, each of said charge transfer channels having, under said transfer electrodes thereof, storage regions capable of storing a signal charge packet therein and minimal-storage regions having substantially no ability to store the signal charge packet, each of said storage regions being responsive to application of a potential of a storage level to the corresponding transfer electrode to store the signal charge packet therein and to application of a potential of a transfer level to the corresponding transfer electrode to receive the signal charge packet from an immediately preceding storage region being at the storage level, and the first channel having the storage regions under only those M (M<P) successive transfer electrodes which are arranged from the m (≥1)th transfer electrode to the (m+M−1)th transfer electrode, the second channel having the storage regions under only those M successive transfer electrodes which are arranged from the (m+1)th transfer electrode to the (M+m)th transfer electrode, and the Nth channel having the storage regions under only those M successive transfer electrodes arranged from the (m+N−1)th transfer electrode to the (M+m+N−2)th (≤P) transfer electrode the minimal storage regions of each channel being located under the remaining (P−M) electrodes exclusive of said M successive electrodes of each channel; and
means for applying N-phase non-overlapping clock pulse signals to said transfer electrodes of each of said transfer channels, said clock pulse signals each being normally biased to the storage level and pulsed to the transfer level so that N successive transfer electrodes in each of said charge transfer channels are successively set to the transfer level in the direction opposite to the charge transfer direction whereby the first to Nth transfer channels are sequentially enabled to receive signal charge packets from said input node and to sequentially transfer signal charge packets to said output node, and, in each of said transfer channels, a signal charge packet is shifted one storage region in the charge transfer direction during one cycle period of said N-phase clock pulse signals while said storage regions are sequentially made empty in the direction opposite to the charge transfer direction each time the clock pulse signal is pulsed.

4. A charge transfer device according to claim 3 wherein said minimal storage regions disposed between said input node and the first storage regions of the respective charge transfer channels each includes a fat "O" barrier region enabling these minimal-storage regions to store a fat "O" charge when they are biased at the storage level.

5. A charge transfer device according to claim 3 wherein said minimal-storage regions disposed between said output node and the last storage regions of the respective charge transfer channels each include a suppressed barrier region such that these minimal-storage regions have substantially no charge storing capability.

6. A charge transfer device according to claim 3 further comprising merging shift register means having an input connected to the outputs of said charge transfer channels and an output connected to said output node, said merging shift register means being driven by a clock signal having a frequency N times that of said N-phase clock pulse signals to serially receive signal charge packets from said charge transfer channels and successively transfer the signal charge packets to said output node.

7. A charge transfer device according to claim 3 wherein each of said transfer electrodes is formed of double conductive layers.

8. A charge transfer device according to claim 3 wherein said storage regions each include a semiconductor region formed in said substrate adjacent the major surface thereof and having the same conductivity type as said substrate and higher impurity concentration than said substrate.

9. A charge transfer device according to claim 3 wherein said storage regions each include a portion of the insulating layer which is thicker than the remaining portion of the insulation layer under the associated transfer electrode.

* * * * *